(12) United States Patent
Kitayama et al.

(10) Patent No.: US 12,446,223 B2
(45) Date of Patent: Oct. 14, 2025

(54) SEMICONDUCTOR STORAGE DEVICE AND METHOD FOR MANUFACTURING SEMICONDUCTOR STORAGE DEVICE

(71) Applicant: Kioxia Corporation, Tokyo (JP)

(72) Inventors: Hiroki Kitayama, Yokkaichi Mie (JP); Tomotaka Ariga, Yokkaichi Mie (JP); Mitsuo Ikeda, Yokkaichi Mie (JP); Daisuke Ikeno, Yokkaichi Mie (JP); Akihiro Kajita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 418 days.

(21) Appl. No.: 18/177,734

(22) Filed: Mar. 2, 2023

(65) Prior Publication Data
US 2023/0413555 A1  Dec. 21, 2023

(30) Foreign Application Priority Data
Jun. 15, 2022 (JP) .................. 2022-096444

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 41/37
See application file for complete search history.

(56) References Cited

U.S. PATENT DOCUMENTS

| | | | |
|---|---|---|---|
| 9,620,366 B2 * | 4/2017 | Nakao | H01L 21/0338 |
| 10,170,494 B2 | 1/2019 | Ishizaki | |
| 2014/0175530 A1 * | 6/2014 | Chien | H10D 30/0413 |
| | | | 438/264 |
| 2017/0062466 A1 | 3/2017 | Ishizaki | |
| 2018/0102375 A1 | 4/2018 | Pang | |
| 2018/0233513 A1 | 8/2018 | Zhang | |
| 2018/0294187 A1 | 10/2018 | Thombare | |
| 2019/0013388 A1 | 1/2019 | Han | |
| 2023/0092843 A1 | 3/2023 | Ikeda | |

FOREIGN PATENT DOCUMENTS

JP  2020513065 A  4/2020

* cited by examiner

*Primary Examiner* — Robert J May
(74) *Attorney, Agent, or Firm* — Kim & Stewart LLP

(57) ABSTRACT

According to one embodiment, a semiconductor storage device includes a memory pillar extending in a first direction. The memory pillar includes a tunnel insulation film, a charge storage layer on the tunnel insulation film, and a first block insulation film on the charge storage layer. A conductor layer extends in a second direction intersecting the first direction to meet a portion of the memory pillar. The conductor layer includes a first layer comprising molybdenum and a second layer comprising tungsten. The first layer is between the memory pillar and the second layer in the second direction.

20 Claims, 17 Drawing Sheets

SEMICONDUCTOR STORAGE DEVICE AND METHOD FOR MANUFACTURING SEMICONDUCTOR STORAGE DEVICE

CROSS-REFERENCE TO RELATED APPLICATION(S)

This application is based upon and claims the benefit of priority from Japanese Patent Application No. 2022-096444, filed Jun. 15, 2022, the entire contents of which are incorporated herein by reference.

FIELD

Embodiments described herein relate generally to a semiconductor storage device and a method for manufacturing a semiconductor storage device.

BACKGROUND

A semiconductor storage device such as a NAND flash memory generally includes a plurality of conductor layers that function as word lines. Tungsten is often used as a material of these conductor layers. In recent years, other materials for these conductor layer have been studied. For example, molybdenum has been studies as material for conductor layers having low resistance.

DETAILED DESCRIPTION

In general, according to one embodiment, a semiconductor storage device includes a memory pillar and a conductor layer. The memory pillar extends in a first direction and includes a tunnel insulation film, a charge storage layer on the tunnel insulation film, and a first block insulation film on the charge storage layer. The conductor layer extends in a second direction intersecting the first direction and includes a first layer comprising molybdenum and a second layer comprising tungsten. The first layer is between the memory pillar and the second layer in the second direction.

Hereinafter, certain example embodiments will be described with reference to the accompanying drawings. In order to facilitate understanding of the description, the same elements are denoted by the same reference symbols, and overlapping descriptions may be omitted.

Figure 1:
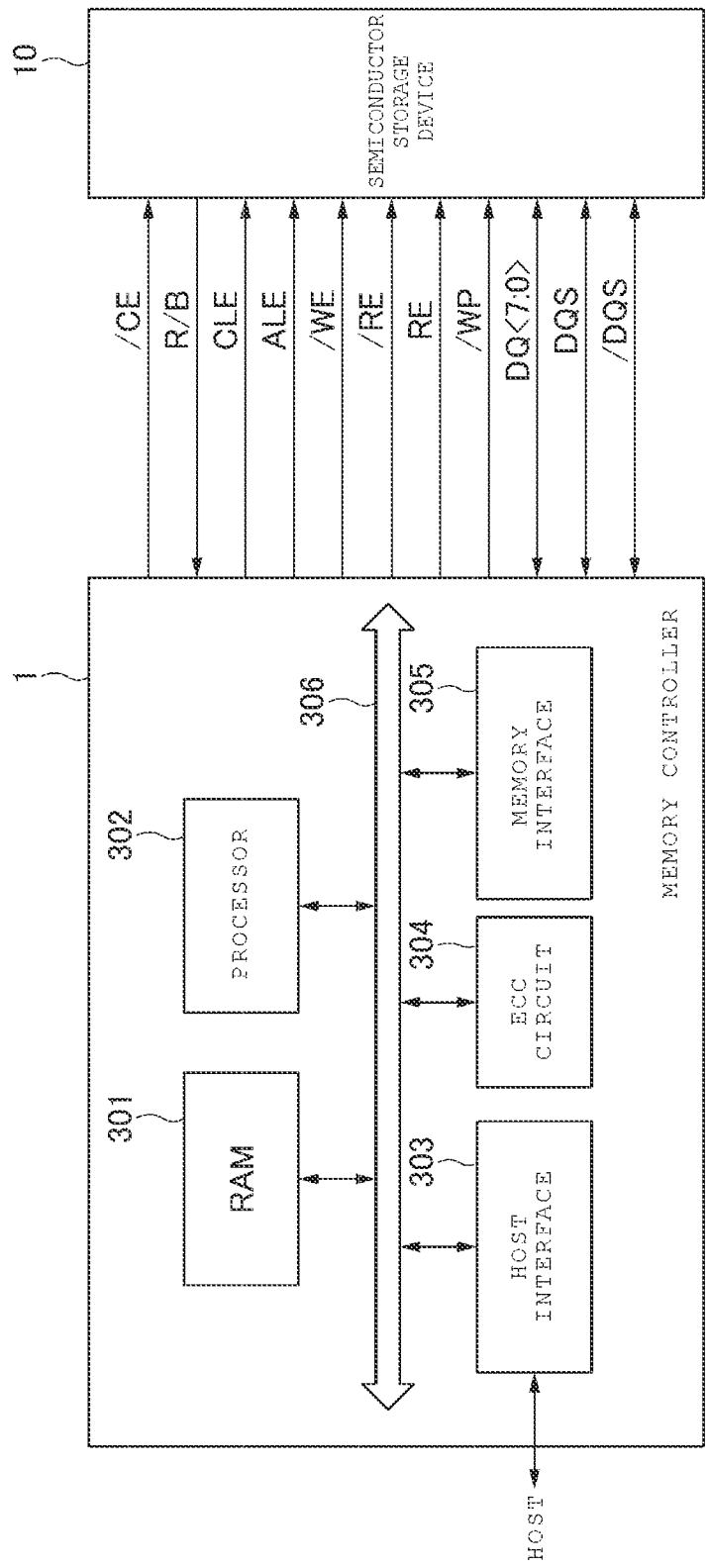
FIG. 1 is a block diagram showing a configuration example of a memory system according to a first embodiment.

A first embodiment will be described. A semiconductor storage device 10 according to the first embodiment is a non-volatile storage device configured as a NAND flash memory. FIG. 1 shows a configuration example of a memory system including the semiconductor storage device 10 as a block diagram. This memory system includes a memory controller 1 and the semiconductor storage device 10. Although a plurality of semiconductor storage devices 10 are actually provided in the memory system of FIG. 1, only one of them is shown in FIG. 1 for purposes of representational clarity. This memory system can be connected to a host. The host is, for example, an electronic device such as a personal computer or a mobile terminal.

The memory controller 1 controls writing of data to the semiconductor storage device 10 according to write requests from the host. The memory controller 1 also controls reading of data from the semiconductor storage device 10 in accordance with read requests from the host.

Between the memory controller 1 and the semiconductor storage device 10, several signals are transmitted, such as a chip enable signal /CE, a ready-busy signal R/B, a command latch enable signal CLE, an address latch enable signal ALE, a write enable signal /WE, read enable signals RE and /RE, a write protect signal /WP, a data signal DQ<7:0>, and data strobe signals DQS and /DQS.

The chip enable signal /CE is a signal for enabling the semiconductor storage device 10. The ready-busy signal R/B is a signal for indicating whether the semiconductor storage device 10 is presently in a ready state or a busy state. The "ready state" is a state in which a command from an outside can be accepted. The "busy state" is a state in which a command from the outside can not be accepted. The command latch enable signal CLE is a signal indicating that the information of signal DQ<7:0> is a command. The address latch enable signal ALE is a signal indicating that the information of signal DQ<7:0> is an address. The write enable signal /WE is a signal indicating the received signal (information) should be accepted by the semiconductor storage device 10 and is asserted each time the memory controller 1 receives a command, address, and data. The memory controller 1 instructs the semiconductor storage device 10 to take in the signal DQ<7:0> while the signal /WE is at an "L (Low)" level.

The read enable signals RE and /RE are signals for the memory controller 1 to read data from the semiconductor storage device 10. These are used, for example, to control the operation timing of the semiconductor storage device 10 when outputting the signal DQ<7:0>. The write protect signal /WP is a signal for instructing the semiconductor storage device 10 to prohibit writing and erasing of data. The signal DQ<7:0> is the data (information) communicated between semiconductor storage device 10 and the memory controller 1, and includes commands, addresses, and the data to be written to semiconductor storage device 10 or the data that has been read from semiconductor storage device 10. The data strobe signal DQS is a signal for controlling input/output timing of the signal DQ<7:0>. The signal /DQS is a complementary (inverted) signal of the signal DQS.

The memory controller 1 includes a RAM 301, a processor 302, a host interface 303, an ECC circuit 304 and a memory interface 305. The RAM 301, the processor 302, the host interface 303, the ECC circuit 304, and the memory interface 305 are interconnected through an internal bus 306.

The host interface 303 outputs a request received from the host, user data (write data), or the like to the internal bus 306. The host interface 303 also transmits the user data read from the semiconductor storage device 10, a response from the processor 302, or the like to the host.

The memory interface 305 controls the process of writing the user data or the like to the semiconductor storage device 10 and the process of reading it from the semiconductor storage device 10 based on instructions from the processor 302.

The processor 302 comprehensively controls the memory controller 1. The processor 302 is, for example, a CPU, an MPU, or the like. After receiving the request from the host through the host interface 303, the processor 302 performs control according to the request. For example, the processor 302 instructs the memory interface 305 to write the user data and parity to the semiconductor storage device 10 according to the request from the host. The processor 302 also instructs the memory interface 305 to read the user data and parity from the semiconductor storage device 10 according to the request from the host.

The processor 302 determines a storage area (memory area) on the semiconductor storage device 10 for the user data stored in the RAM 301. The user data can be stored in the RAM 301 through the internal bus 306. The processor 302 executes the determination of the memory area for data (page data) of a page unit, which is a writing unit. The user data stored in one page of the semiconductor storage device 10 is hereinafter also referred to as "unit data" or "data of a write unit size). The unit data is generally encoded and stored in the semiconductor storage device 10 as a codeword. This encoding is optional in the present embodiment. In some examples, the memory controller 1 may store the unit data in the semiconductor storage device 10 without encoding, but FIG. 1 shows a configuration in which encoding is performed as one possible configuration example. When the memory controller 1 does not encode, the page data matches the unit data. In addition, a codeword may be generated based on each unit data increment or a codeword may be generated based on divided data (sub-unit data) obtained by dividing unit data. In addition, a codeword may be generated using a plurality of unit data.

The processor 302 determines (selects) the memory area of the semiconductor storage device 10 to be used as a write destination for each unit data. A physical address is assigned to the memory areas of the semiconductor storage device 10. The processor 302 manages the memory areas of the write destinations of unit data using the physical address. The processor 302 instructs the memory interface 305 to designate the selected memory area (a physical address) and write the user data into semiconductor storage device 10 at the selected physical address. The processor 302 manages correspondence between the logical address of user data (the logical address is managed by the host) its physical address. When receiving a read request including a logical address from the host, the processor 302 identifies the physical address corresponding to the logical address, designates the physical address, and instructs the memory interface 305 to read the user data accordingly.

The ECC circuit 304 encodes user data stored in the RAM 301 to generate a codeword. The ECC circuit 304 also decodes the codeword(s) read from the semiconductor storage device 10. The ECC circuit 304 detects and corrects errors in data by using, for example, a checksum or the like added to the user data.

The RAM 301 temporarily stores the user data received from the host until stored in the semiconductor storage device 10, and also temporarily stores the data read from the semiconductor storage device 10 before being transmitted to the host. The RAM 301 is, for example, a general-purpose memory such as an SRAM and a DRAM.

FIG. 1 shows a configuration example in which the memory controller 1 includes the ECC circuit 304 and the memory interface 305 as separate components. However, the ECC circuit 304 may be built into the memory interface 305 in some examples. In addition, the ECC circuit 304 may be incorporated into the semiconductor storage device 10 in some examples. The specific configuration and disposition of each element/component shown in FIG. 1 are not particularly limited.

When receiving a write request from the host, the memory system of FIG. 1 operates as follows. The processor 302 temporarily stores data (the data to be written) in the RAM 301. The processor 302 reads the data stored in the RAM 301 and sends the data to the ECC circuit 304. The ECC circuit 304 encodes the data and sends a corresponding codeword to the memory interface 305. The memory interface 305 writes the codeword to the semiconductor storage device 10.

When receiving a read request from the host, the memory system of FIG. 1 operates as follows. The memory interface 305 receives the codeword read from the semiconductor storage device 10 and sends this codeword to the ECC circuit 304. The ECC circuit 304 decodes the codeword and stores the now decoded data in RAM 301. The processor 302 transmits the data from the RAM 301 to the host through the host interface 303.

Figure 2:
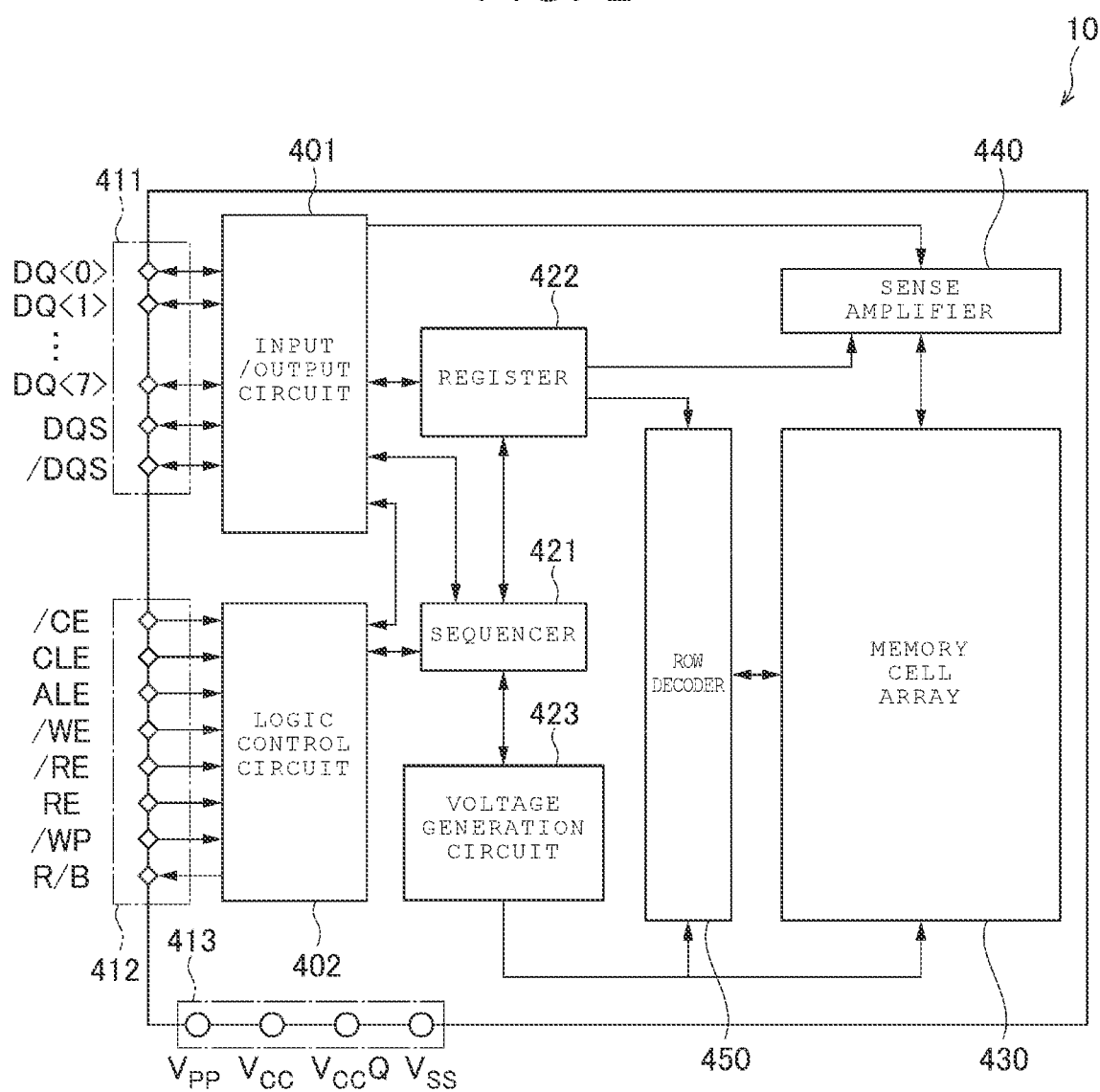
FIG. 2 is a block diagram showing a configuration of a semiconductor storage device according to a first embodiment.

A configuration of the semiconductor storage device will be described. As shown in FIG. 2, the semiconductor storage device 10 includes a memory cell array 430, a sense amplifier 440, a row decoder 450, an input/output circuit 401, a logic control circuit 402, a sequencer 421, a register 422, a voltage generation circuit 423, an input/output pad group 411, a logic control pad group 412, and a power supply input terminal group 413.

The memory cell array 430 stores data. The memory cell array 430 has a plurality of memory cell transistors MT associated with a plurality of bit lines BL and a plurality of word lines WL. A specific configuration of the memory cell array 430 will be described later with reference to FIGS. 3 to 6.

The sense amplifier 440 is a circuit for adjusting a voltage applied to the bit line BL, reading (sensing) the voltage of the bit line BL, and converting the read/sensed voltages into data. When reading the data, the sense amplifier 440 acquires the read data read from the memory cell transistor MT via the bit line BL, and transfers the acquired read data to the input/output circuit 401. When writing data, the sense amplifier 440 transfers the write data through the bit line BL to the memory cell transistor MT. The operation of the sense amplifier 440 is controlled by the sequencer 421.

The row decoder 450 is a circuit configured as a switch group for applying voltages to each word line WL. The row decoder 450 receives a block address and a row address from the register 422, selects a corresponding block based on the block address, and selects a corresponding word line WL based on the row address. The row decoder 450 switches between opening and closing of the switch group elements so that the voltage from the voltage generation circuit 423 is applied to the selected word line WL. The operation of the row decoder 450 is controlled by the sequencer 421.

The input/output circuit 401 communicates the signal DQ<7:0> and the data strobe signals DQS and /DQS with the memory controller 1. The input/output circuit 401 transfers the commands and the addresses in the signal DQ<7:0> to the register 422. In addition, the input/output circuit 401 communicates the write data and the read data with the sense amplifier 440.

The logic control circuit 402 receives the chip enable signal /CE, the command latch enable signal CLE, the address latch enable signal ALE, the write enable signal /WE, the read enable signals RE and /RE, and the write protect signal /WP from the memory controller 1. In addition, the logic control circuit 402 transfers the ready-busy signal R/B to the memory controller 1 to notify the state of the semiconductor storage device 10 to the outside.

The sequencer 421 controls the operation of each unit, including the memory cell array 430, based on control signals input from the memory controller 1 to the input/output circuit 401 and the logic control circuit 402.

The register 422 is a portion that temporarily stores a command and an address. The register 422 stores commands that instruct a write operation, a read operation, an erasing operation, and the like. The command is input from the memory controller 1 to the input/output circuit 401, then transferred from the input/output circuit 401 to the register 422, and stored therein.

In addition, the register 422 also stores the address corresponding to the commands. After being input from the memory controller 1 to the input/output circuit 401, the address is transferred from the input/output circuit 401 to the register 422 and stored therein.

Furthermore, the register 422 also stores status information indicating the present operating state of the semiconductor storage device 10. The status information is updated by the sequencer 421 according to changes in the operating state of the memory cell array 430 and the like. The status information can be output from the input/output circuit 401 to the memory controller 1 as a status signal in response to a request from the memory controller 1.

The voltage generation circuit 423 generates voltage(s) necessary for data write operations, read operations, and erasing operations in the memory cell array 430. Such a generated voltages include, for example, the voltage applied to each word line WL, the voltage applied to each bit line BL, or the like. The operation of the voltage generation circuit 423 is controlled by the sequencer 421.

The input/output pad group 411 is provided with a plurality of terminals (pads) for communicating the various signals between the memory controller 1 and the input/output circuit 401. A terminal is individually provided corresponding to each of the signal DQ<7:0> (e.g., eight terminals are provided for the signal DQ<7:0> components) as well as the data strobe signals DQS and /DQS.

The logic control pad group 412 is provided with a plurality of terminals (pads) for communicating signals between the memory controller 1 and the logic control circuit 402. A terminal is individually provided corresponding to each of the chip enable signal /CE, the command latch enable signal CLE, the address latch enable signal ALE, the write enable signal /WE, the read enable signals RE and /RE, the write protect signal /WP, and the ready-busy signal R/B.

The power supply input terminal group 413 is provided with a plurality of terminals for receiving application (supply) of voltages necessary for the operation of the semiconductor storage device 10. The voltages include power supply voltages Vcc, VccQ, Vpp, a ground voltage Vss, or the like.

The power supply voltage Vcc is a circuit power supply voltage applied from the outside as an operating power supply, and is, for example, a voltage of about 3.3 V. The power supply voltage VccQ is, for example, a voltage of 1.2 V. The power supply voltage VccQ is a voltage used when a signal is being communicated between the memory controller 1 and the semiconductor storage device 10. The power supply voltage Vpp is a power supply voltage higher than the power supply voltage Vcc and is, for example, a voltage of 12 V.

Figure 3:
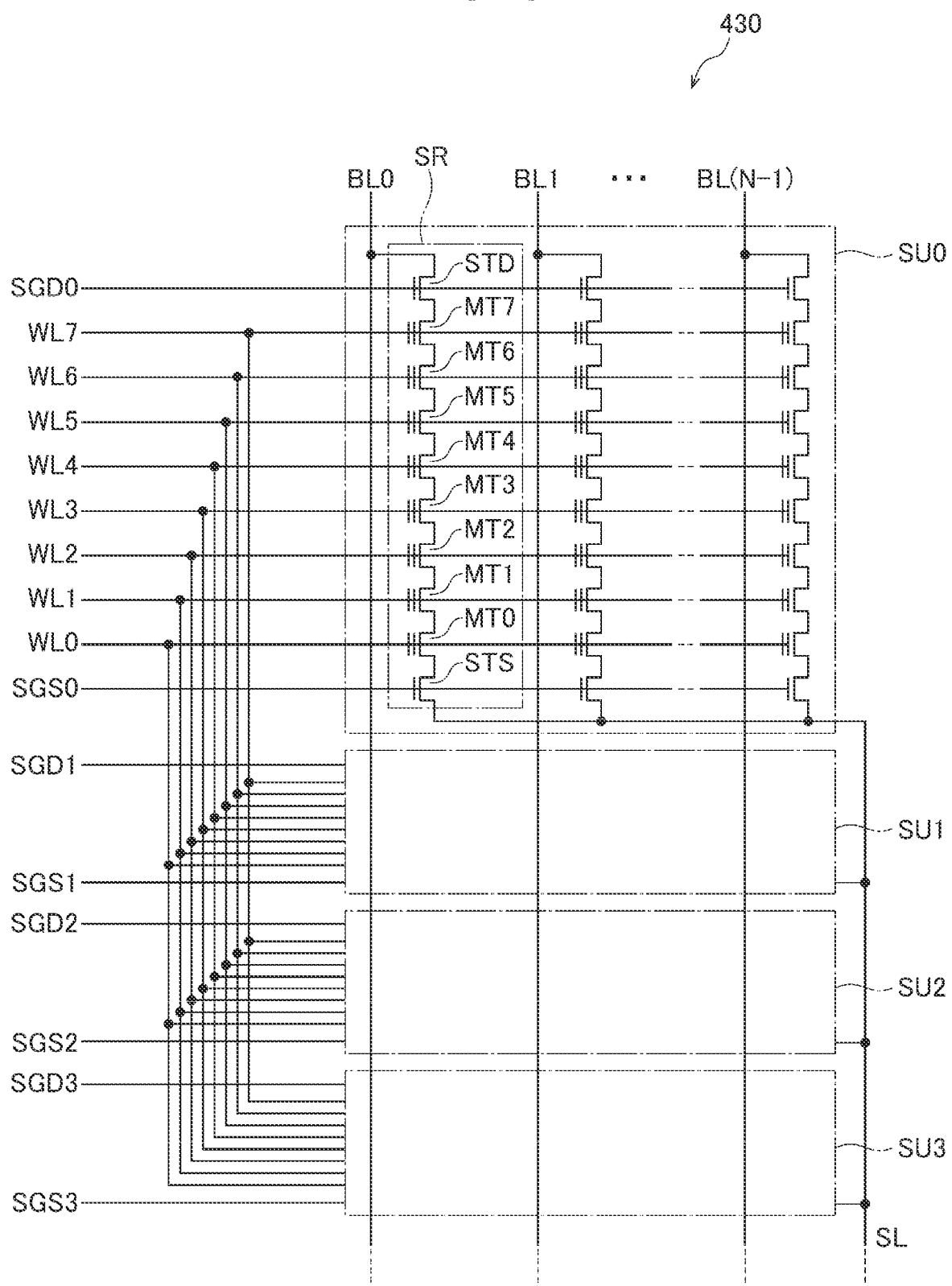
FIG. 3 is a diagram showing an equivalent circuit of a semiconductor storage device according to a first embodiment.

FIG. 3 shows the configuration of the memory cell array 430 as an equivalent circuit diagram. As shown in FIG. 3, the memory cell array 430 includes a plurality of string units SU0 to SU3. Each of the string units SU0 to SU3 includes a plurality of NAND strings SR. Each NAND string SR includes, for example, eight memory cell transistors MT0 to MT7 and two select transistors STD and STS. The number of memory cell transistors and select transistors provided in the NAND string SR may differ from the example in FIG. 1.

A plurality of string units (e.g., SU0 to SU3) constitute one block, and the memory cell array 430 is provided with a plurality of such blocks. Only a single block is shown in FIG. 3, and the illustration of other blocks is omitted.

In the following description, the string units SU0 to SU3 may also be referred to as a "string unit SU" without distinguishing between them. Similarly, the memory cell transistors MT0 to MT7 may also be referred to as a "memory cell transistor MT" without distinguishing between them.

Each string unit SU includes the same number of NAND strings SR as the N bit lines BL0 to BL(N−1). N is a positive integer in this context. The memory cell transistors MT0 to MT7 provided in each NAND string SR are disposed in series between a source of the select transistor STD and a drain of the select transistor STS. The drain of the select transistor STD is connected to one of the bit lines BL0 to BL(N−1). The source of the select transistor STS is connected to the source line SL. In the following description, the bit lines BL1 to BL(N−1) are sometimes referred to as "bit line BL" without distinguishing between them.

As will be described later, each memory cell transistor MT is configured as a transistor having a charge storage layer in the gate portion. The amount of charge stored in the charge storage layer corresponds to the data stored in the memory cell transistor MT. The memory cell transistor MT may be of a charge trap type using, for example, a silicon nitride film as the charge storage layer, or may be of a floating gate type using, for example, a silicon film as the charge storage layer.

Gates of the select transistors STD provided in the string unit SU0 are all connected to the select gate line SGD0. The select gate line SGD0 is a line to which a voltage is applied for switching between opening and closing of each select transistor STD. Similarly, for the string units SU1 to SU3, the select gate lines SGD1 to SGD3 for applying the voltage to the select transistor STD are provided corresponding to the respective string units SU.

The gates of the select transistors STS provided in the string unit SU0 are all connected to the select gate line SGS0. The select gate line SGS0 is a line to which a voltage is applied for switching between opening and closing of each select transistor STS. Similarly, for the string units SU1 to SU3, the select gate lines SGS1 to SGS3 for applying the voltage to the select transistor STS are provided corresponding to the respective string units SU. The select gate line SGS may be shared among the string units SU0 to SU3 of the same block, and the gates of all the select transistors ST2 provided in the string units SU0 to SU3 may be connected to the common select gate line SGS.

Respective gates of memory cell transistors MT0 to MT7 are connected to the word lines WL0 to WL7. The voltage applied to the word lines WL0 to WL7 is for the purpose of switching the opening and closing of the memory cell transistors MT0 to MT7 and changing the charge amount stored in each charge storage layer of the memory cell transistors MT0 to MT7.

The data writing and reading in the semiconductor storage device 10 are collectively performed by a unit (unit size) called a "page" of a plurality of memory cell transistors MT connected to the same word line WL in a string unit SU. Erasing of data in the semiconductor storage device 10 is collectively performed for all memory cell transistors MT in a block. As specific methods for writing, reading, and erasing such data, various known methods may be employed, and therefore detailed description thereof will be omitted.

Figure 4:
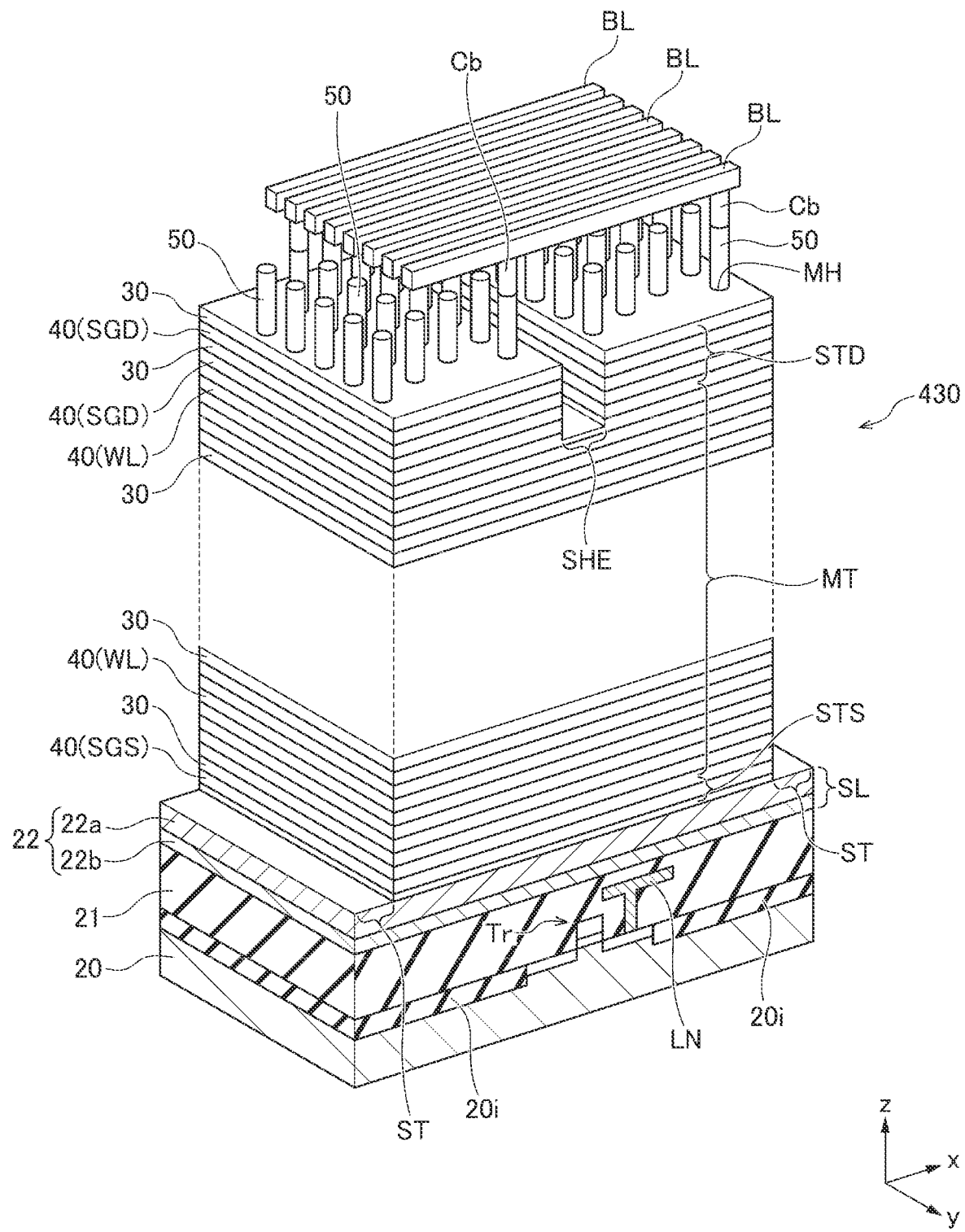
FIG. 4 depicts a semiconductor storage device according to a first embodiment.

FIG. 4 shows a schematic perspective view of the configuration of the memory cell array 430 and its surroundings in the semiconductor storage device 10. As shown in FIG. 4, the semiconductor storage device 10 includes a substrate 20, an insulator layer 21, a semiconductor layer 22, a plurality of insulator layers 30 and conductor layers 40. A z direction shown in FIG. 4 is a direction perpendicular to a surface of the substrate 20. An x direction shown in the drawing is a direction perpendicular to the z direction and is a direction in which the bit lines BL extend. A y direction shown in the drawing is a direction perpendicular to both the z direction and the x direction.

The substrate 20 is a plate-like member having a flat surface on the z direction side in FIG. 4, and is, for example, a silicon wafer (or portion thereof). The insulator layer 21, the semiconductor layer 22, the insulator layer 30, the conductor layer 40, and the like, are multi-layered films formed by, for example, chemical vapor deposition (CVD) film formation on the z direction side of the substrate 20. For example, an element isolation region 20i is provided on the surface of the substrate 20. The element isolation region 20i can be an insulation region containing silicon oxide and separates the source and drain regions of the transistor Tr.

The insulator layer 21 is made of an insulating material such as silicon oxide. For example, peripheral circuits including the above-described transistor Tr, the wiring LN, and the like are formed on the surface side of the substrate 20. This peripheral circuit includes the sense amplifier 440, the row decoder 450, and the like shown in FIG. 2. The insulator layer 21 entirely covers these peripheral circuits.

The semiconductor layer 22 functions as the source line SL in FIG. 3. For example, the semiconductor layer 22 is made of a material containing silicon, such as polycrystalline silicon doped with impurities. The semiconductor layer 22 is embedded in the insulator layer 21 in a portion that is the −z direction side of the memory cell array 430.

The semiconductor layer 22 may be entirely made of a semiconductor material such as silicon, but, as in the example of FIG. 4, may also have a two-layer structure including the semiconductor layer 22a and the conductive layer 22b. For example, the semiconductor layer 22a is a semiconductor material such as silicon, and the conductive layer 22b is a metal material such as tungsten.

A plurality of insulator layers 30 and conductor layers 40 are formed on the upper (+z) side of the semiconductor layer 22 and alternately disposed in a stack along the z direction in FIG. 4.

The conductor layer 40 is made of a material containing molybdenum or the like. Conductor layers 40 are used as the word lines WL0 to WL7, the select gate lines SGS1 and SGD1, and the like depicted in FIG. 3. Each conductor layer 40 comprises a plurality of layers of different materials, but the illustration of this aspect is omitted in FIG. 4. The insulator layer 30 is disposed at a position between the conductor layers adjacent to each other and electrically insulates between them. For example, the insulator layer 30 is made of silicon oxide.

In a region in which the insulator layers 30 and conductor layers 40 are stacked along the z direction, a plurality of memory holes MH penetrate through them along the z direction and a memory pillar 50 is formed inside the memory holes MH. Each memory pillar 50 is formed in a range from the insulator layer closest to the z direction to the semiconductor layer 22. Each memory pillar 50 corresponds to a NAND string SR shown in FIG. 3.

Figure 5:
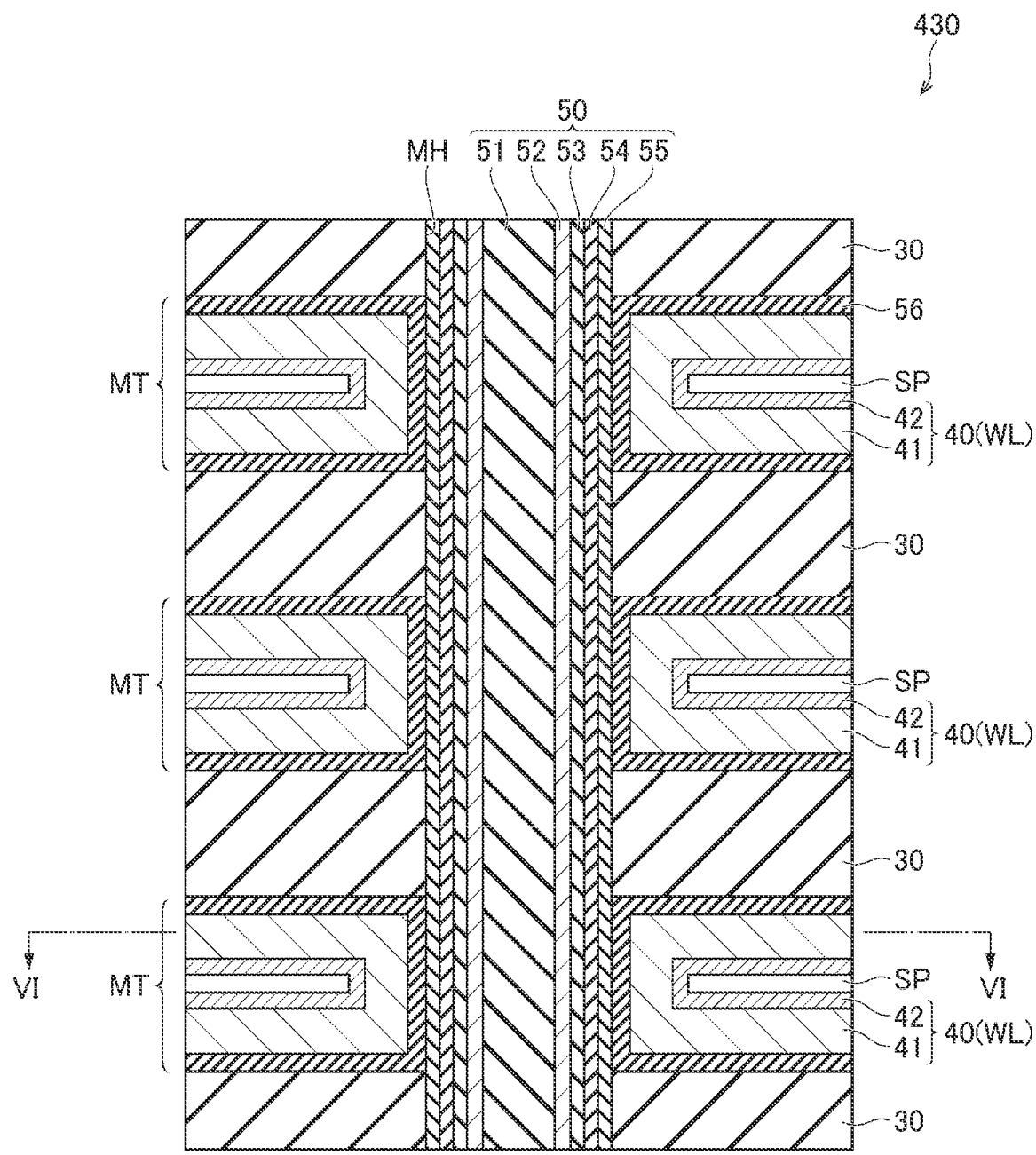
FIG. 5 is a cross-sectional view of a semiconductor storage device according to a first embodiment.

FIG. 5 shows a cross section when the memory pillar is cut along a plane (for example, the x-z plane) passing through a central axis along a longitudinal direction thereof. Further, FIG. 6 shows cross-section taken at a line VI-VI of FIG. 5.

Figure 6:
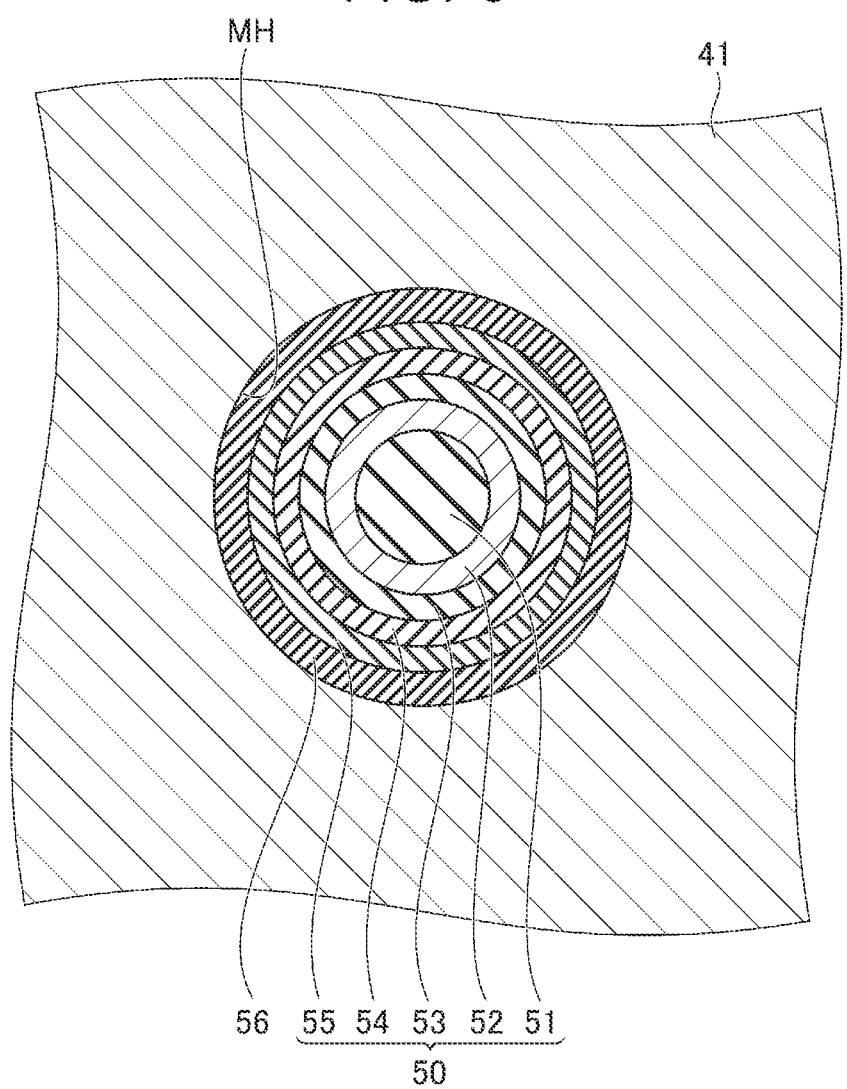
FIG. 6 is a cross-view taken at a VI-VI line of FIG. 5.

As shown in FIG. 6, the memory pillar 50 has a substantially circular cross-sectional shape. The memory pillar 50 has a core portion 51, a semiconductor portion 52, a tunnel insulation film 53, a charge trapping film 54, and a block insulation film 55.

The core portion 51 is a portion of the memory pillar that is provided closest to the center. For example, the core portion 51 is made of an insulating material such as silicon oxide.

The semiconductor portion 52 is a film formed as a layer covering the core portion 51 from the outer peripheral side. For example, the semiconductor portion 52 is made of a material containing amorphous silicon, and is where a channel of the memory cell transistor MT or the like is formed. Alternatively, the core portion 51 may not be provided, and the semiconductor portion 52 may be provided at the center of the memory pillar 50.

The tunnel insulation film 53 is formed as a layer covering the semiconductor portion 52 from the outer peripheral side. For example, the tunnel insulation film 53 contains silicon oxide, or silicon oxide and silicon nitride. The tunnel insulation film 53 is for forming a potential barrier between the semiconductor portion 52 and the charge trapping film 54. For example, when injecting electrons from the semiconductor portion 52 to the charge trapping film 54 (e.g., during a write operation) and when injecting holes from the semiconductor portion 52 to the charge trapping film 54 (e.g., during an erasing operation), electrons or holes pass through the potential barrier of the tunnel insulation film 53.

The charge trapping film 54 is formed as a layer covering the outside of the tunnel insulation film 53. For example, the charge trapping film 54 contains silicon nitride and has a trap site that traps charges in the film. A portion of the charge trapping film 54 sandwiched between the conductor layer (which is a word line WL) and the semiconductor portion 52 constitutes the storage region of the memory cell transistor MT and functions as the "charge storage layer" described above. A threshold voltage of the memory cell transistor MT changes depending on the presence or absence of charge in the charge trapping film 54 or the amount of the stored charge. Thereby, the memory cell transistor MT stores information.

The block insulation film 55 is for preventing back tunneling of charges from the conductor layer 40 to the charge trapping film 54 side. As a material of the block insulation film 55, for example, metal oxide such as aluminum oxide, silicon oxide, or the like may be used.

As shown in FIG. 5, the conductor layer 40 is entirely covered with the block insulation film 56 on the outer peripheral side thereof. The block insulation film 56 is for preventing back tunneling of charges from the conductor layer 40 to the charge trapping film 54 side similar to the block insulation film described above. In the present embodiment, the block insulation film is thus formed as a double film. As the material of the block insulation film 56, a metal oxide such as aluminum oxide, silicon oxide, or the like may be used similar to the block insulation film 55.

In the present embodiment, each conductor layer 40 includes a first layer 41 and a second layer 42. The first layer 41 is a layer provided on the outer side (that is, on the block insulation film 56 side) of the conductor layer 40, and is made of a material comprising molybdenum (Mo) as a main component. For example, the first layer 41 is a layer of molybdenum alone (e.g., unalloyed molybdenum). The second layer 42 is a layer provided inside the first layer 41, that is, at a position on the opposite side of the block insulation film 56 with the first layer 41 sandwiched therebetween, and is made of material comprising tungsten (W) as a main component. For example, the second layer 42 is a layer of tungsten alone (unalloyed tungsten).

Inside the second layer 42, a space SP can be formed. The space SP is a minute space formed in the process of manufacturing the semiconductor storage device 10. The thickness of the space SP might not be uniform, and depending on the location, there may even be portions where the thickness is zero (that is, no space SP is present at such a location), but in FIG. 5, the space SP is schematically drawn as a space with uniform thickness.

As described above, the memory cell array 430 of the semiconductor storage device 10 includes the tunnel insulation film 53, the charge trapping film 54 provided on the tunnel insulation film 53, and the conductor layer 40 provided on the charge trapping film 54 through the block insulation films 55 and 56. The conductor layer 40 includes the first layer 41 (containing molybdenum) and the second layer 42 (containing tungsten), which is a layer provided at a position on the opposite side of the block insulation films 55 and 56 with the first layer 41 sandwiched therebetween. Advantages of a conductor layer 40 having such a multilayer structure will be described later.

Portions of the memory pillars 50 adjacent to each conductor layer 40 function as a transistor. That is, each memory pillar 50 forms a plurality of transistors connected in series along the longitudinal direction the memory pillar 50. Each conductor layer 40 functions as a gate electrode of each of these transistors through the block insulation films 55 and 56, and the charge trapping film 54. The semiconductor portion 52 functions as the channel of the transistor.

Some of the transistors arranged along the longitudinal direction of the memory pillar 50 function as the memory cell transistors MT in FIG. 3. Other transistors formed at both ends of the plurality of memory cell transistors MT function as the select transistors STD and STS in FIG. 3.

Returning to FIG. 4, a plurality of bit lines BL are provided on the z direction side of the memory pillars 50. Each bit line BL is formed as a linear wiring extending along the x direction, and disposed in rows spaced from each other along the y direction. The upper end of each memory pillar 50 is connected to a bit line BL through a contact Cb. Thereby, the semiconductor portion 52 of each memory pillar 50 is electrically connected to a bit line BL.

The stacked conductor layers 40 and insulator layers 30 are divided into a plurality of different layers (regions) by a slit ST. The slit ST is a linear groove extended along the y direction, and is formed to a depth reaching the semiconductor layer 22, for example.

In addition, upper portions of the stacked conductor layers 40 and insulator layers 30 are separated by a slit SHE. The slit SHE is a shallow groove which extends along the y direction. The slit SHE is formed to such a depth as to divide only the select gate lines SGD among the plurality of conductor layers 40.

At an end portion of the memory pillar 50 on the −z direction side, the tunnel insulation film 53 and the like are removed, and the semiconductor portion 52 is connected to the semiconductor layer 22. Thereby, the semiconductor layer 22 (functioning as the source line SL) and the channel of each transistor along the memory pillars MP are electrically connected.

A method for manufacturing the semiconductor storage device 10 will be described below.

Stacking Step

Figure 7:
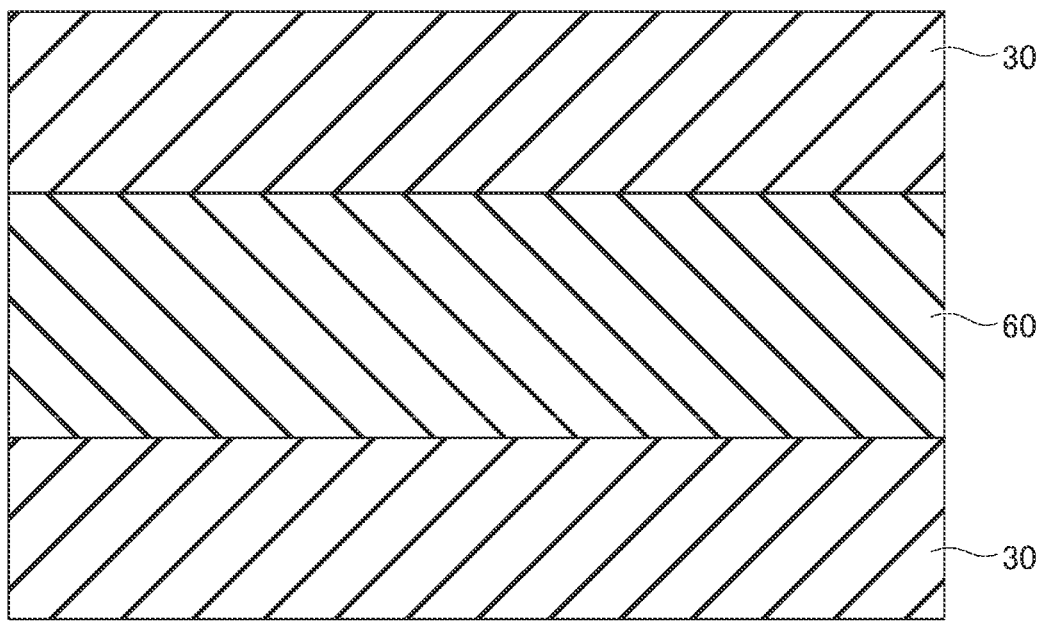
FIGS. 7 to 13 depict aspects of a method for manufacturing a semiconductor storage device according to a first embodiment.

First, after forming the peripheral circuit on the surface of the substrate 20, the insulator layer 21 covering the peripheral circuit and the semiconductor layer 22 covering the insulator layer 21 are formed. After that, a plurality of insulator layers 30 and sacrificial layers 60 are alternately stacked on the upper surface of the semiconductor layer 22. The sacrificial layer 60 is a layer that ultimately gets replaced by a conductor layer 40 in a later step. For example, silicon nitride is used as such a sacrificial layer 60. FIG. 7 shows a portion of the stacked insulator layer 30 and sacrificial layer 60. A stacking direction (vertical direction in FIG. 7) is the same as the z direction in FIG. 4.

Memory Hole Forming Step

Figure 8:
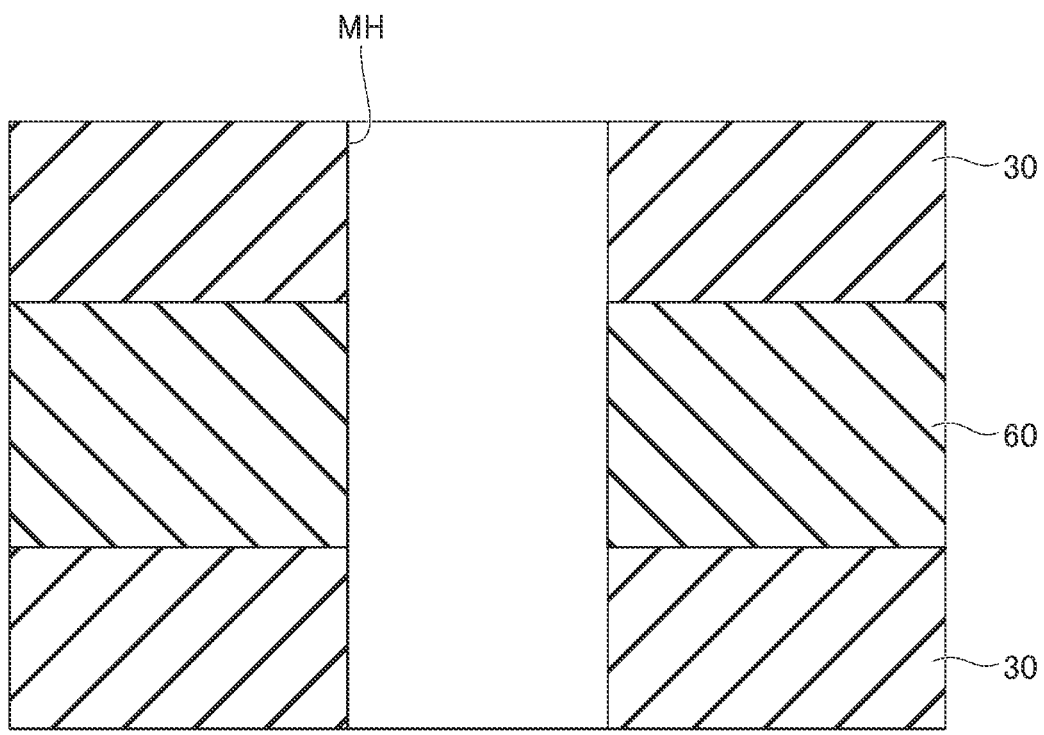

After the stacking step, a memory hole forming step is performed. In the memory hole forming step, the memory holes MH are formed in respective portions of the stacked insulator layer 30 and sacrificial layer 60 corresponding in position to the later formed memory pillars 50. The memory hole MH is a substantially cylindrical elongated hole extending in the z direction in FIG. 4, and is formed by reactive ion etching (RIE), for example. For example, the memory hole MH is formed to a depth reaching the semiconductor layer 22. FIG. 8 shows a state in which the memory hole forming step has been completed.

Memory Pillar Forming Step

Figure 9:
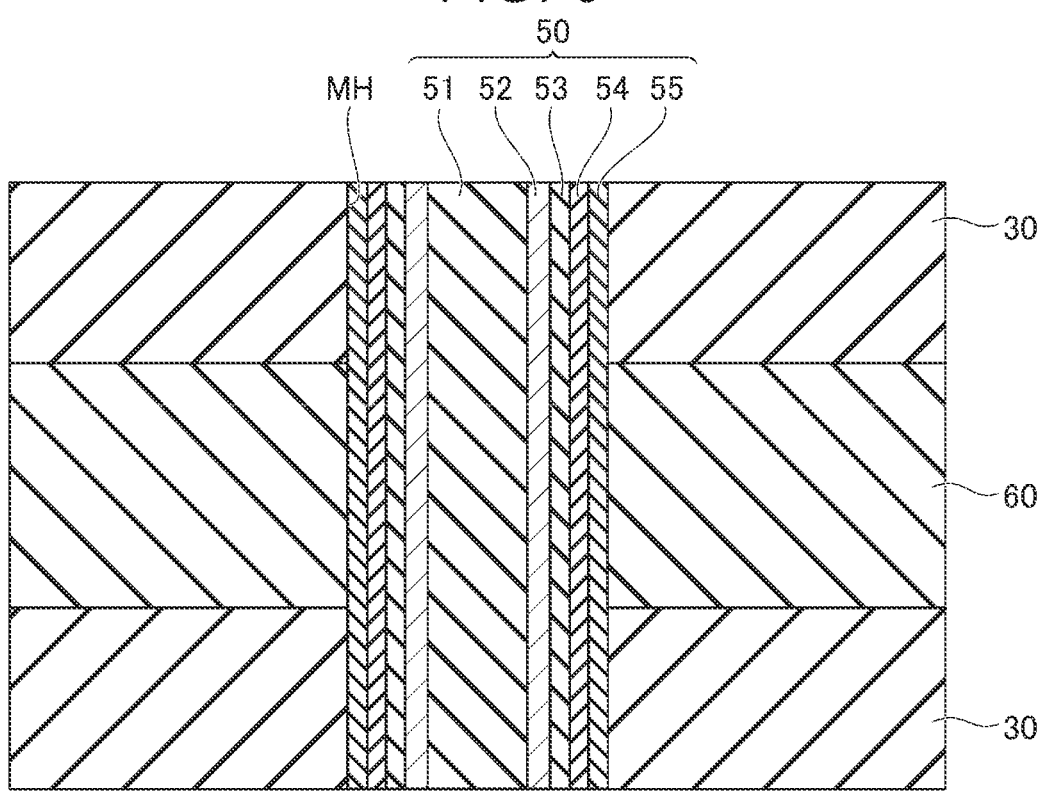

After the memory hole forming step, a memory pillar forming step is performed. In the memory pillar forming step, the memory pillars 50 are formed inside the memory holes MH. Specifically, the block insulation film 55, the charge trapping film 54, the tunnel insulation film 53, the semiconductor portion 52, and the core portion 51 are formed in this order on the inner surface of the memory hole MH by, for example, CVD film formation. FIG. 9 shows a state in which the memory pillar forming step has been completed.

Sacrificial Layer Removing Step

Figure 10:
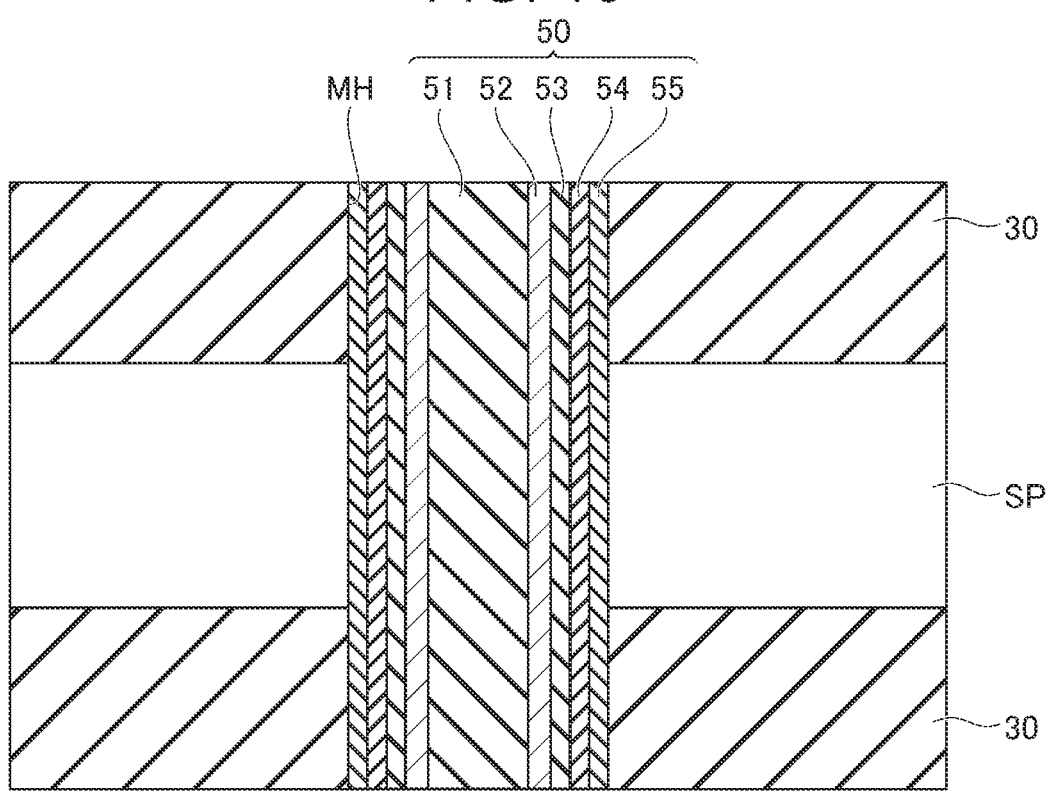

After the memory pillar forming step, a sacrificial layer removing step is performed. In the sacrificial layer removing step, first, the slit ST shown in FIG. 4 is first formed. Thereby, the stacked insulator layers 30 and the sacrificial layers 60 are divided into separate portions. After that, the sacrificial layer 60 is removed by wet etching performed through the slit ST. At this time, each stacked insulator layer 30 remains but with a gap (space SP) left therebetween. Since each insulator layer 30 is supported by the memory pillars 50 in the process (as well as by support columns (not shown)), the shape thereof can be maintained. FIG. 10 shows a state in which the sacrificial layer removal step has been completed.

Insulation Film Forming Step

Figure 11:
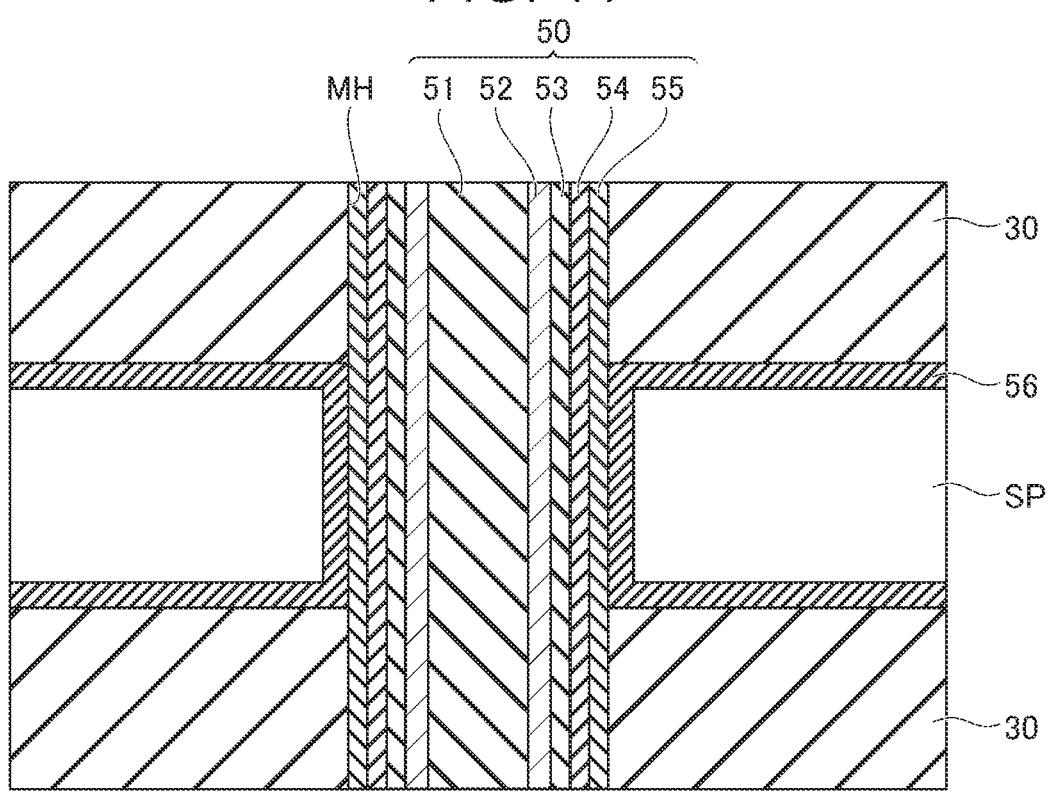

After the sacrificial layer removing step, an insulation film forming step is performed. In the insulation film forming step, the block insulation film 56 covers the entire exposed surface inside the space SP. For example, the block insulation film 56 is formed by CVD or atomic layer deposition (ALD). FIG. 11 shows a state in which the insulation film forming step has been completed.

Conductor Layer Forming Step

Figure 12:
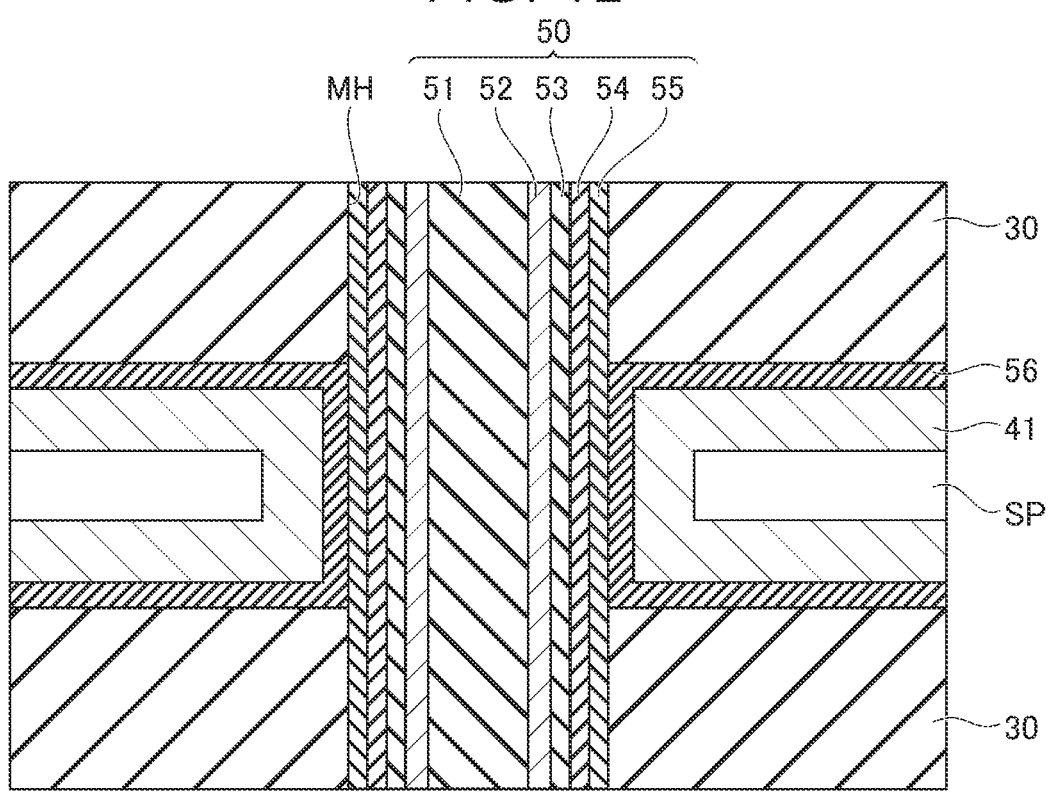
Figure 13:
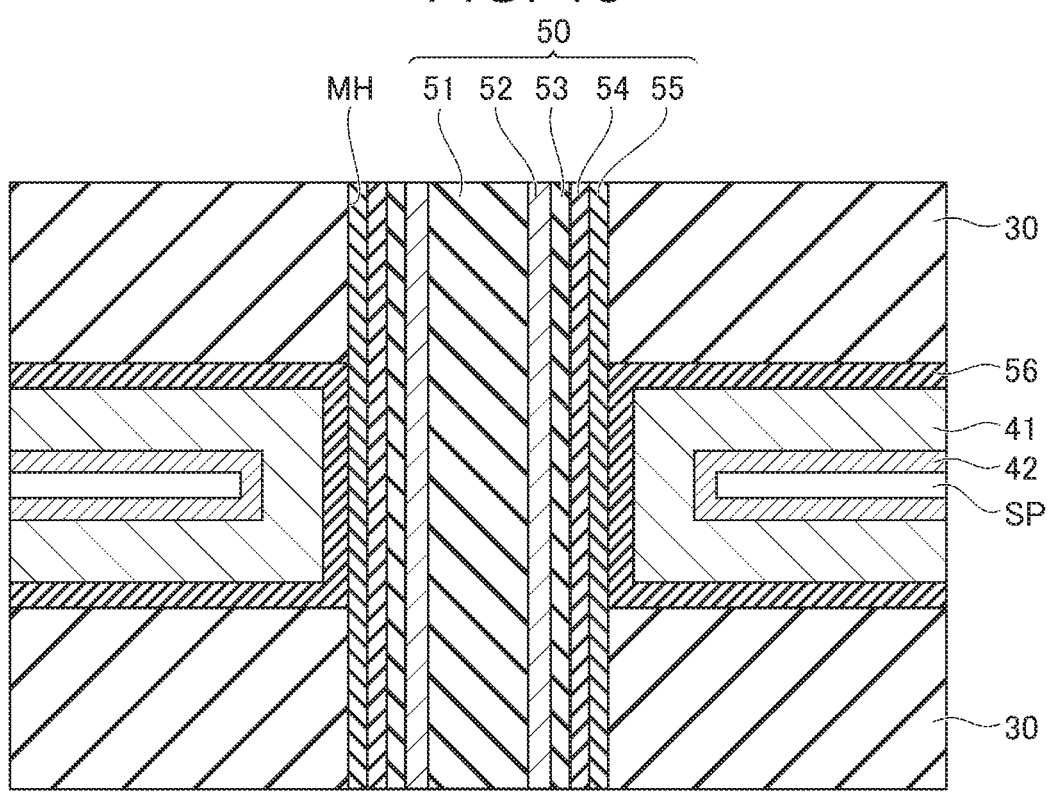

After the insulation film forming step, a conductor layer forming step is performed. In the conductor layer forming step, the conductor layer 40 covers the inner exposed surface of the block insulation film 56 that now defines the space SP. Specifically, as shown in FIG. 12, the first layer 41 is first formed on the block insulation film 56. Subsequently, as shown in FIG. 13, the second layer 42 is formed on the first layer 41. Thus, the memory cell array 430 having the configuration shown in FIG. 5 is completed. The thickness of the first layer 41 is preferably 5 nm or more. The thickness of the second layer 42 is preferably in the range of 3 nm to 5 nm. For example, the thickness of the first layer 41 is thicker than the thickness of the second layer 42. Here, the "thickness" may refer to a dimension in the z direction, for example.

In the related art, tungsten (W) has often been used as the material for the conductive layers provided as the word lines. However, along with the miniaturization and performance improvements of semiconductor storage devices, the use of molybdenum for purpose layer is being investigated.

However, molybdenum is well-known in this context to be a material into which oxygen diffuses more easily than tungsten. Therefore, when the molybdenum layer being used as a word line is exposed to atmosphere or the like during manufacturing, there is considered to be a possibility that oxygen will undesirably diffuse into the molybdenum and thus the performance of the resulting semiconductor storage device deteriorates.

In the present embodiment, after forming the conductor layer 40 with the first layer 41 containing molybdenum as a main component, the outer surface (space SP side) of the first layer 41 is covered with a second layer 42 containing tungsten as a main component.

In the conductor layer forming step described above, both the first layer 41 and the second layer 42 are formed by, for example, CVD or ALD. When forming the first layer 41, a gas comprising, for example, $MoO_2Cl_2$, $MoOCl_4$, $H_2$, $NH_3$, or the like may be used as the raw material gas. When forming the second layer 42, a gas containing, for example, $WF_6$, $H_2$, $B_2H_6$, $SiH_4$, or the like may be used as the raw material gas. In forming the second layer 42, $NH_3$ may be used instead of $SiH_4$ in some examples.

After the first layer 41 is formed in a film forming apparatus (e.g., a deposition chamber), the second layer 42 may be formed by changing the type of gas to be supplied to the film forming apparatus, or the like without taking the semiconductor storage device 10 out of the apparatus. That is, the formation of the first layer 41 and the formation of the second layer 42 can be continuously (sequentially) performed without being exposed to the outside air. Since outside air is not introduced into the space SP while in the state of FIG. 12, the surface of the first layer 41 can be covered with the second layer 42 without the first layer 41 being exposed to the outside air. Thereby, it is possible to prevent the oxidation of the first layer 41 (containing molybdenum) and the diffusion of oxygen into the first layer 41 can be avoided.

In the state shown in FIG. 13, a part of the space SP still remains after the second layer 42 is formed. When the semiconductor storage device 10 is taken out from the film forming apparatus after the conductor layer forming step has been completed, there will be a possibility that outside air is introduced into the space SP and the second layer 42 will be exposed to the outside air.

However, the second layer 42 (containing tungsten as a main component) is a layer for which oxygen diffusion is difficult, as described above. Since the first layer 41 is covered with such a second layer 42, diffusion of oxygen into the first layer 41 is sufficiently prevented by the second layer acting as a diffusion barrier or the like. Therefore, the performance degradation of the semiconductor storage device 10 due to the diffusion of oxygen is prevented.

The first layer 41 may contain nitrogen and chlorine as a result of being formed from raw material gases such as $MoO_2Cl_2$, $MoOCl_4$, $H_2$, and $NH_3$ as described above. In some examples, the first layer 41 may contain just one of nitrogen or chlorine depending on the selection of raw material gases utilized. In either case, the concentration of nitrogen atoms or chlorine atoms contained as impurities in the first layer 41 is preferably kept to $1\times10^{19}$ atoms/cm$^3$ or less, and more preferably $1\times10^{18}$ atoms/cm$^3$ or less.

The second layer 42 may be a film containing fluorine (F) as an impurity as a result of using $WF_6$ as a raw material gas during film formation. When the fluorine in the second layer 42 diffuses and reaches the block insulation film 55 (which may be aluminum oxide or the like), there is a possibility that the block insulation film 55 deteriorates. However, in the present embodiment, since the first layer 41 is sandwiched between the second layer 42 and the block insulation film 55, fluorine is sufficiently prevented from reaching the block insulation film 55. Therefore, even when $WF_6$ is used as the raw material gas for the second layer 42, there is no substantial problem. If it is necessary to further prevent the migration of fluorine, a gas containing $WOCl_4$, $H_2$, $B_2H_6$, $SiH_4$ (or $NH_3$), and the like may be used as the raw material gas for forming the second layer 42. Next, a second embodiment will be described. In the following, points different from the first embodiment will be mainly described, and descriptions of points common to the first embodiment will be omitted as appropriate.

The semiconductor storage device 10 according to the second embodiment differs from the first embodiment in the content of the conductor layer forming step and the structure of the conductor layer 40 formed as a result thereof.

Figure 14:
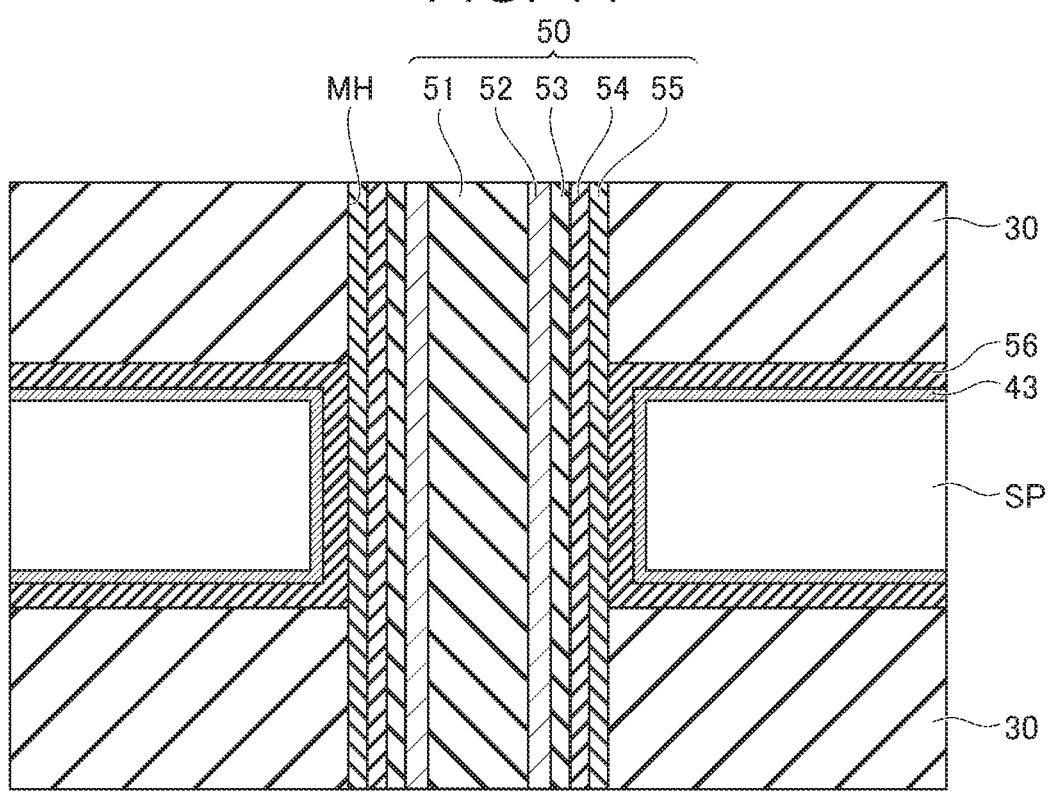
FIG. 14 depicts aspects of a method for manufacturing a semiconductor storage device according to a second embodiment.

After the block insulation film 56 is formed in the insulation film forming step, in the second embodiment, a third layer 43 is first formed on the block insulation film 56 as shown in FIG. 14. The third layer 43 is a film made of a material containing tungsten as a main component. The third layer 43 is, for example, a layer of tungsten alone. The third layer 43 covers the entire surface of the block insulation film 56 on the opposite side of the block insulation film 55 and the insulator layer 30. A thickness of the third layer 43 is preferably 3 nm or more, and more preferably 4 nm or more. For example, the thickness of the third layer 43 is less than the thickness of the first layer 41. The third layer 43 is formed, for example, by CVD or ALD similar to the first layer 41 and the second layer 42. When the third layer 43 is formed, a gas containing, for example, $WOCl_4$, $H_2$, $B_2H_6$, $SiH_4$, or the like may be used as a raw material gas. $NH_3$ may be used instead of $SiH_4$ in some examples.

Figure 15:
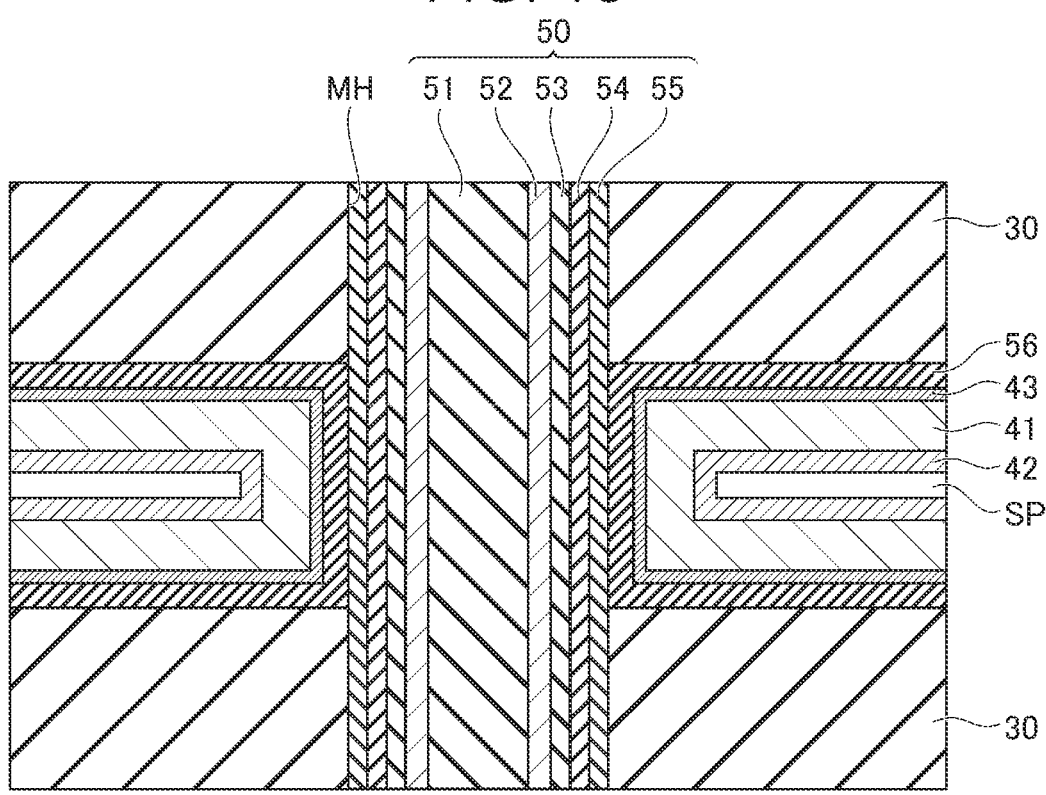
FIG. 15 is a cross-sectional view of a semiconductor storage device according to the second embodiment.

After that, the first layer 41 and the second layer 42 are formed in order similar to the conductor layer forming step in the first embodiment. That is, in the second embodiment, the third layer 43 (containing tungsten) is formed on the block insulation film 56, and the first layer 41 and the second layer 42 are formed on the third layer 43 in this order. The formation of the third layer 43, the formation of the first layer 41, and the formation of the second layer 42 are preferably performed continuously (in sequence) while shut off from the outside air. The thickness of the second layer 42 is preferably in the range of 2 nm to 4 nm in the second embodiment. FIG. 15 shows the state in which the formation of the conductor layer 40 has been completed. That is, FIG. 15 depicts the configuration of the semiconductor storage device 10 according to the second embodiment.

In the semiconductor storage device 10 according to the second embodiment, the conductor layer 40 further includes the third layer 43. The third layer 43 is a layer provided at a position on the opposite side of the second layer 42 with the first layer 41 sandwiched therebetween, and is provided as a layer containing tungsten.

The third layer 43 containing tungsten as a main component has a function of preventing diffusion of oxygen toward the block insulation film 55. It is noted that, in the present embodiment, since the penetration and diffusion of oxygen are sufficiently prevented by the second layer 42, the necessity of preventing the diffusion of oxygen by the third layer 43 may be small. Therefore, the third layer 43 can be formed thinner and thus the electrical resistance of the conductor layer 40 can be approximately the same level as in the first embodiment. Further, by providing the third layer 43 (with the function of preventing diffusion of oxygen), the second layer 42 could be made thinner than that in the first embodiment. Furthermore, by sandwiching with the third layer 43, it is possible to promote an increase in grain size of the molybdenum in the first layer 41 and thus reduce resistance.

Since the third layer 43 is located near the block insulation film 55, it is preferable for the third layer 43 not to contain fluorine as an impurity. Therefore, in the second embodiment, a gas containing $WOCl_4$, $H_2$, $B_2H_6$, $SiH_4$, or the like (that is, a gas without fluorine) can be used as the raw material gas, so that the amount of fluorine contained in the third layer 43 is reduced as much as possible. The concentration of fluorine atoms in the third layer 43 is preferably $1 \times 10^{17}$ atoms/cm³ or less.

Next, a third embodiment will be described. In the following, points different from the second embodiment (FIG. 15) will be mainly described, and descriptions of points common to the second embodiment will be omitted as appropriate.

Figure 16:
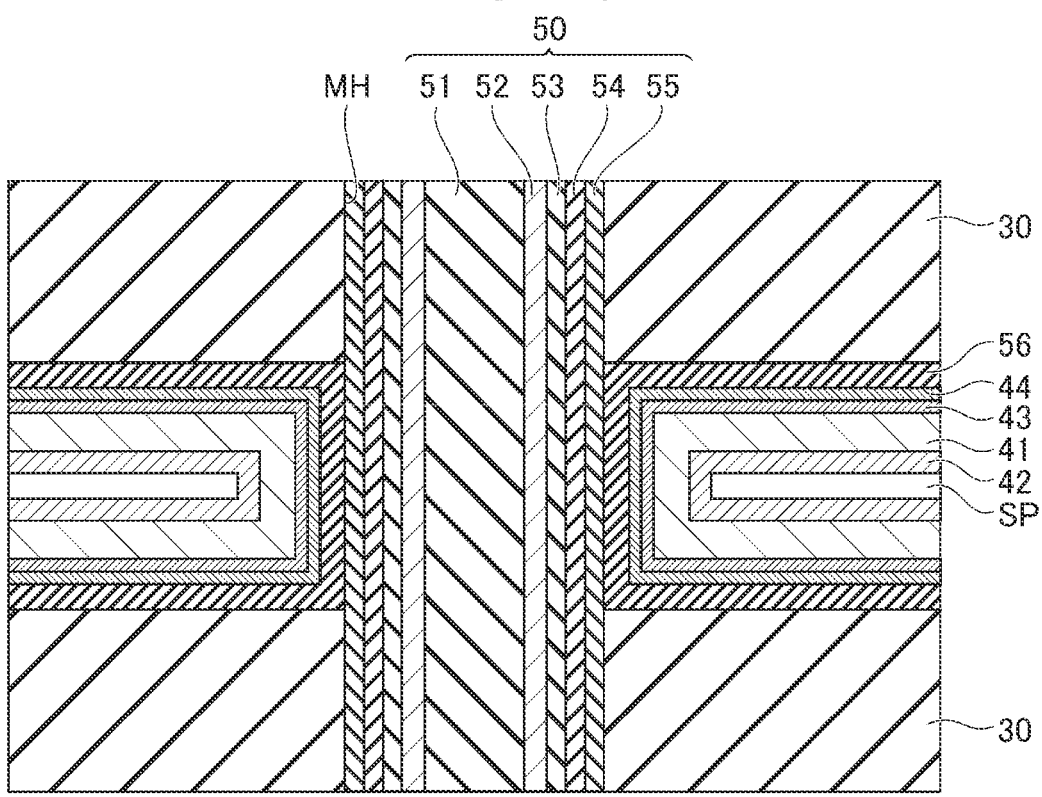
FIG. 16 is a cross-sectional view of a semiconductor storage device according to a third embodiment.

As shown in FIG. 16, the semiconductor storage device according to the third embodiment further includes a fourth layer 44. The fourth layer 44 is provided between the block insulation film 56 and the conductor layer 40, specifically between the block insulation film 56 and the third layer 43. The fourth layer 44 functions as a so-called "barrier metal", and is formed of a material containing titanium nitride (TiN) in the third embodiment. By providing the fourth layer 44, the adhesion of the conductor layer 40 to the block insulation film 56 can be improved. The fourth layer 44, in some examples, may be made of a material containing molybdenum nitride (MoN) or tungsten nitride (WN). The fourth layer 44 may contain at least one of nitrogen, titanium, molybdenum, and tungsten.

The fourth layer 44 covers the entire surface of the block insulation film 56 on the opposite side of the block insulation film 55 and the insulator layer 30. The fourth layer 44 is formed by, for example, CVD or ALD, similar to the first layer 41 and the like. After that, the third layer 43, the first layer 41, and the second layer 42 are formed in this order similar to the second embodiment. The formation of the fourth layer 44, the formation of the third layer 43, the formation of the first layer 41, and the formation of the second layer 42 are preferably performed continuously (in sequence) without exposure to outside air.

Next, a fourth embodiment will be described. In the following, points different from the third embodiment (FIG. 16) will be mainly described, and descriptions of points common to the third embodiment will be omitted as appropriate.

Figure 17:
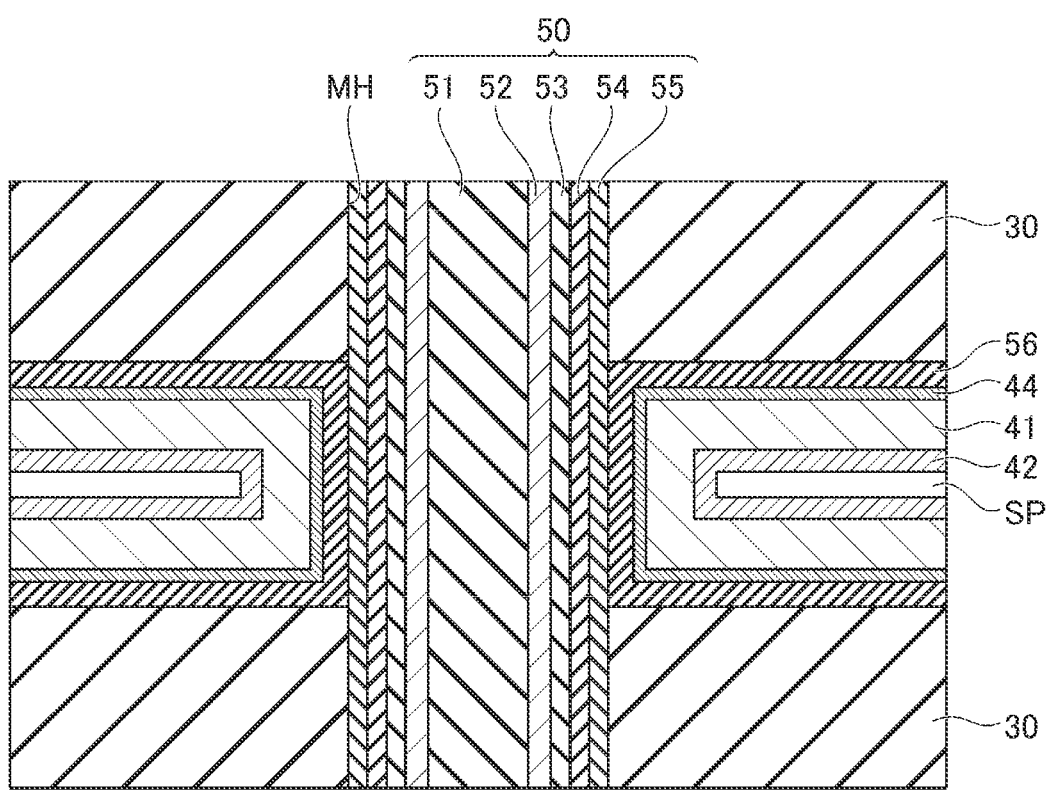
FIG. 17 is a cross-sectional view of a semiconductor storage device according to a fourth embodiment.

As shown in FIG. 17, in the semiconductor storage device 10 according to the fourth embodiment, the third layer 43 is not provided, but the fourth layer 44 is provided between the block insulation film 56 and the conductor layer 40, specifically between the block insulation film 56 and the first layer 41 similar to that of the third embodiment.

In the fourth embodiment, after the fourth layer 44 is formed on the block insulation film 56, the first layer 41 and the second layer 42 are formed on the fourth layer 44 in this order. The formation of the fourth layer 44, the formation of the first layer 41, and the formation of the second layer 42 are preferably performed continuously (in sequence) without exposure to outside air.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
    a memory pillar extending in a first direction and including:
        a tunnel insulation film,
        a charge storage layer on the tunnel insulation film, and
        a first block insulation film on the charge storage layer; and
    a conductor layer extending in a second direction intersecting the first direction, the conductor layer including:
        a first layer comprising molybdenum, and
        a second layer comprising tungsten, wherein
    the first layer is between the memory pillar and the second layer in the second direction.

2. The semiconductor storage device according to claim 1, wherein
    the conductor layer further includes:
        a third layer comprising tungsten, and
    the first layer is between the second and third layers in the second direction.

3. The semiconductor storage device according to claim 2, wherein a concentration of fluorine atoms in the third layer is
    $1 \times 10^{17}$ atoms/cm³ or less.

4. The semiconductor storage device according to claim 2, wherein the conductor layer further includes:
a fourth layer between the memory pillar and the third layer in the second direction.

5. The semiconductor storage device according to claim 4, wherein the fourth layer comprises at least one of titanium nitride, molybdenum nitride, or tungsten nitride.

6. The semiconductor storage device according to claim 1, wherein
the conductor layer further includes:
a third layer comprising at least one of titanium nitride, molybdenum nitride, and tungsten nitride, and
the third layer is between the memory pillar and the first layer in the second direction.

7. The semiconductor storage device according to claim 1, wherein the first layer further comprises at least one of nitrogen and chlorine.

8. The semiconductor storage device according to claim 7, wherein a concentration of nitrogen atoms in the first layer is greater than zero but less than $1 \times 10^{18}$ atoms/cm$^3$.

9. The semiconductor storage device according to claim 7, wherein a concentration of chlorine atoms in the first layer is greater than zero but less than $1 \times 10^{18}$ atoms/cm$^3$.

10. The semiconductor storage device according to claim 1, wherein
the conductor layer further includes:
a second block insulation film,
the second block insulation film is between the first block insulation film and the first layer in the second direction, and
the second block insulation film covers the outer surfaces of the conductor layer.

11. A semiconductor memory device, comprising:
a stacked body of insulating layers and conductor layers stacked one on the other; and
a memory pillar extending in a first direction through the stacked body and including:
a tunnel insulation film,
a charge storage layer on the tunnel insulation film, and
a first block insulation film on the charge storage layer and an outer peripheral surface of the memory pillar, wherein
each conductor layer extends in a second direction intersecting the first direction and includes:
a first layer of molybdenum, and
a second layer of tungsten, wherein
the first layer is between the memory pillar and the second layer in the second direction.

12. The semiconductor memory device according to claim 11, wherein
each conductor layer further includes:
a third layer of tungsten, and
the first layer is between the second and third layers in the second direction.

13. The semiconductor memory device according to claim 12, wherein
each conductor layer further includes:
a fourth layer between the memory pillar and the third layer in the second direction, and
the fourth layer is at least one of titanium nitride, molybdenum nitride, or tungsten nitride.

14. The semiconductor memory device according to claim 11, wherein
each conductor layer further includes:
a third layer between the memory pillar and the first layer in the second direction, and
the third layer is one of titanium nitride, molybdenum nitride, or tungsten nitride.

15. The semiconductor memory device according to claim 11, wherein
each conductor layer further includes:
a second block insulation film,
the second block insulation film is between the first block insulation film and the first layer in the second direction, and
the second block insulation film covers the outer surfaces of the conductor layer.

16. A method for manufacturing a semiconductor storage device, the method comprising:
forming a memory pillar in a stacked body of insulating layers and sacrificial layers, the memory pillar having a charge storage layer on a tunnel insulation film, and a first block insulation film on the charge storage layer;
removing the sacrificial layers from the stacked body, leaving void spaces in the positions of the removed sacrificial layers, each void space exposing a portion of the first block insulation film on an outer peripheral surface of the memory pillar;
forming a second block insulation film on outer surfaces of the void spaces;
forming a first layer in the void spaces on the second block insulation film, the first layer comprising molybdenum; and
forming a second layer in the void spaces on the first layer, the second layer comprising tungsten.

17. The method according to claim 16, wherein formation of the second layer after the first layer is performed without exposing the first layer to atmosphere.

18. The method according to claim 16, further comprising:
forming a third layer in the void spaces before forming the first layer, the third layer comprising tungsten.

19. The method according to claim 18, further comprising:
forming a fourth layer in the void spaces after forming the third layer but before forming the first layer, the fourth layer comprising at least one of titanium nitride, molybdenum nitride, or tungsten nitride.

20. The method according to claim 16, further comprising:
forming a third layer in the void spaces before forming the first layer, the third layer comprising at least one of titanium nitride, molybdenum nitride, or tungsten nitride.

* * * * *